United States Patent [19]
Zukas et al.

[11] Patent Number: 5,445,889
[45] Date of Patent: Aug. 29, 1995

[54] LOW-TEMPERATURE CURING RESIN SYSTEM

[75] Inventors: Florian J. Zukas, Torrance; Nancy J. Condon, Redondo Beach, both of Calif.

[73] Assignee: Hughes Aircraft Company, Los Angeles, Calif.

[21] Appl. No.: 252,381

[22] Filed: Jun. 1, 1994

Related U.S. Application Data

[63] Continuation of Ser. No. 922,884, Jul. 31, 1992, abandoned.

[51] Int. Cl.$^6$ ............................................. B32B 27/38
[52] U.S. Cl. ................... 428/413; 428/407; 428/408
[58] Field of Search ...................... 428/407, 408, 413

[56] References Cited

U.S. PATENT DOCUMENTS 3,989,673  11/1976  Jenkins et al.

OTHER PUBLICATIONS

Sheng Yen Lee, "Thermomechanical Properties of Polymeric Materials and Related Stresses", *SAMPE Quarterly*, pp. 48–51 (Apr. 1990).

D. A. Saravanos et al., "Concurrent Tailoring of Fabrication Process and Interphase Layer to Reduce Residual Stresses in Metal Matrix Composites", *SAMPE Quarterly*, pp. 36–44 (Jul. 1991).

Barbara F. Howell, "Influence of Expanding Monomer on Carbon Fiber Reinforced Epoxy Composites", Report DTRC-SME-90/20, David Taylor Research Center (Jun. 1990).

*Primary Examiner*—P. C. Sluby
*Attorney, Agent, or Firm*—Elizabeth E. Leitereg; Terje Gudmestad; W. K. Denson-Low

[57] ABSTRACT

A resin system includes 100 parts by weight of an epoxy resin, from about ½ to about 10 parts by weight of an imidazole curing agent, and, optionally, an elastomeric material such as a rubber. The resin system without the elastomer is particularly useful as the matrix of a composite material or a potting compound, and the resin system with the elastomer is particularly useful as an adhesive. The resin system is cured at a low temperature and exhibits essentially no dimensional instability upon curing, and then is preferably post-cured at a higher temperature. The post-cured resin system has a softening temperature substantially higher than the normal post-cure temperature and has good mechanical properties.

6 Claims, 2 Drawing Sheets

FIG. 1.
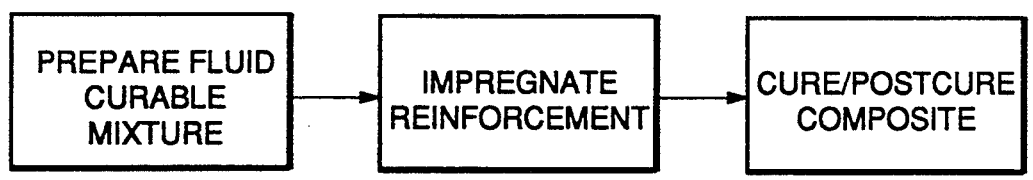
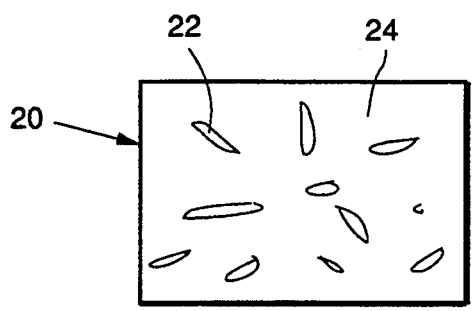
FIG. 2.
FIG. 3.
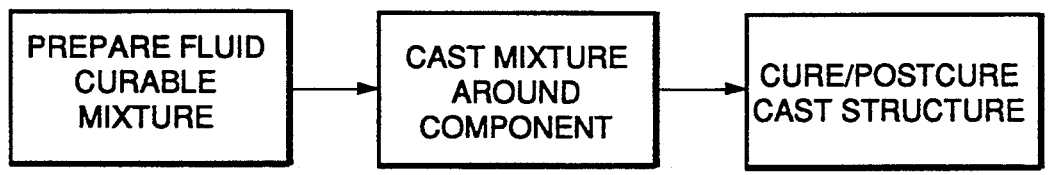
FIG. 4.
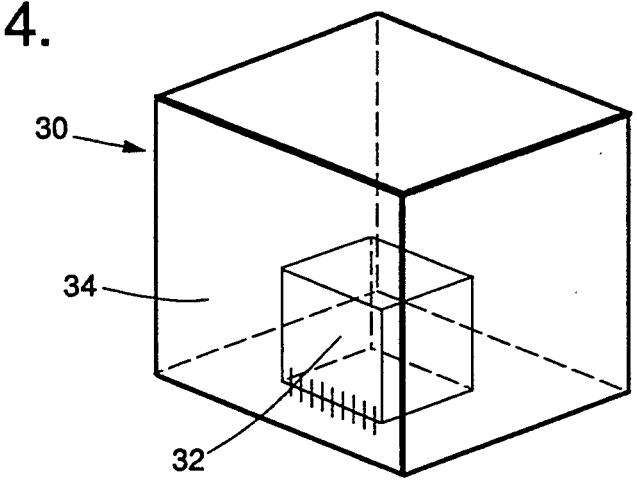

1

LOW-TEMPERATURE CURING RESIN SYSTEM

This is a continuation of application Ser. No. 07/922,884, filed Jul. 31, 1992, now abandoned.

BACKGROUND OF THE INVENTION

This invention relates to nonmetallic curable compositions including a curable resin and a hardener, of particular use in composite matrix and adhesive applications.

Curable nonmetallic resin systems are widely used to form strong bonds between various types of articles. In a conventional adhesive application, curable epoxy-based resins are used to permanently bond pieces of structure together. For example, many aircraft and spacecraft structures are bonded together with curable resins rather than fasteners such as bolts or rivets, to reduce the weight of the structure and improve the performance of the joint. In another application, nonmetallic composite materials are made with a curable resin matrix bonding together reinforcement fibers. The resulting composite materials have very high modulus-to-weight and strength-to-weight ratios.

Curable resin systems are prepared by mixing together at least two components, a resin and a hardener, and then curing the mixture. The resin is ordinarily a flowable organic material which is reacted with the hardener to produce a solid. The mixture is hardened to its full strength by a process termed curing, which involves holding the mixture at some temperature to permit the polymerization reaction to proceed to completion to produce the final properties of the cured resin system. Where the cured is used as an adhesive, it is held between the articles to be bonded during curing. Where the cured resin is to be the matrix of a composite material, the reinforcement is mixed with the resin system before curing, and curing is completed.

A curable resin system must meet other requirements to be acceptable for a particular use, in addition to having the necessary mechanical properties. The resin system must wet and adhere to the articles being bonded, to ensure that the bonded structure achieves its full strength.

The application of the resin system after mixing but before curing is important. The resin system must have the proper consistency for application. It must also have a sufficiently long "pot life" in large batches so that economic amounts of the resin system can be mixed as a batch and retained without hardening prior to application. The resin system should not be too strongly exothermic upon curing, because the heat generation can be so high as to cause degradation and prove hazardous.

A critical consideration for resin systems is that they should not contain noxious or dangerous chemicals that might harm workers during the mixing and application stages. This requirement is an important consideration, as many prior systems use ingredients that are harmful when breathed or touched by humans. These prior systems may achieve operable results, but are increasingly banned from use by safety considerations and governmental regulations.

The resin system should be curable at low temperatures, to achieve low cost, good accuracy of part tolerances and therefore reproducibility, and relatively low tooling costs. When a part must be heated to elevated temperature for curing, it assumes a zero stress state at that temperature. Then, when it is cooled to lower temperature after processing and in service, the differential shrinkage between the components (such as the matrix and the reinforcement of a composite material) introduces internal stresses that can distort and/or crack the part. On a related point, generally resin materials shrink in volume when cured, and this shrinkage can introduce internal stresses in much the same manner as do differential thermal stresses. It is desirable that the resin system undergoes little if any volume change upon curing, or expand slightly.

Existing resin systems that can be cured at low temperatures, while meeting the mechanical property requirements, have shortcomings in respect to one or more of the precuring characteristics, health and safety concerns, and curing characteristics. There is a need for an improved low-temperature curing resin system that satisfies all of these requirements. The present invention fulfills this need, and further provides related advantages.

SUMMARY OF THE INVENTION

The present invention provides a resin system that is curable to the greater part of its ultimate mechanical properties in a temperature range of ambient temperature to 130° F. This resin does not contain noxious components, although normal handling precautions must be taken. It readily is mixed into large batches with a long pot life, and applied to wet the surfaces being bonded together. Polymeric modifiers may be added to the basic resin/curing agent system, without substantial degradation of mechanical properties even as toughness is improved. The resin system is curable at low temperature, and post-curable at higher temperatures of up to about 400° F. to its full strength. Significantly, there is very little volume change on curing, and any volume change is an expansion rather than a contraction. The small volume change means that parts cured at low temperature can be removed from the tooling for higher-temperature post curing. The tooling therefore is not subjected to high temperatures. Structures produced with the resin system of the invention exhibit little microcracking or tendency to warp, a problem with other systems.

In accordance with the invention, a resin system includes 100 parts by weight of an epoxy resin, from about ½ to about 10 parts by weight of an imidazole curing agent, and, optionally, an elastomeric material such as a rubber. The resin system without the elastomer is particularly useful as the matrix of a composite material or a potting compound. The resin system with the elastomer, which has improved toughness, is particularly useful as a structural adhesive.

The present invention provides an important advance in the art of resin systems. The resin system has a desirable combination of mechanical, working, and curing properties, while not utilizing noxious chemicals. Other features and advantages of the invention will be apparent from the following more detailed description of the preferred embodiments, taken in conjunction with the accompanying drawings which illustrate, by way of examples, the principles of the invention.

BRIEF DESCRIPTION OF THE DRAWINGS

FIG. 1 is a process flow chart of a process for preparing a composite material;

FIG. 2 is a sectional view of a composite material prepared by the process of FIG. 1;

FIG. 3 is a process flow chart of a process for preparing a potted structure;

FIG. 4 is a perspective view of a potted structure prepared by the process of FIG. 3;

DETAILED DESCRIPTION OF THE INVENTION

Figure 5:
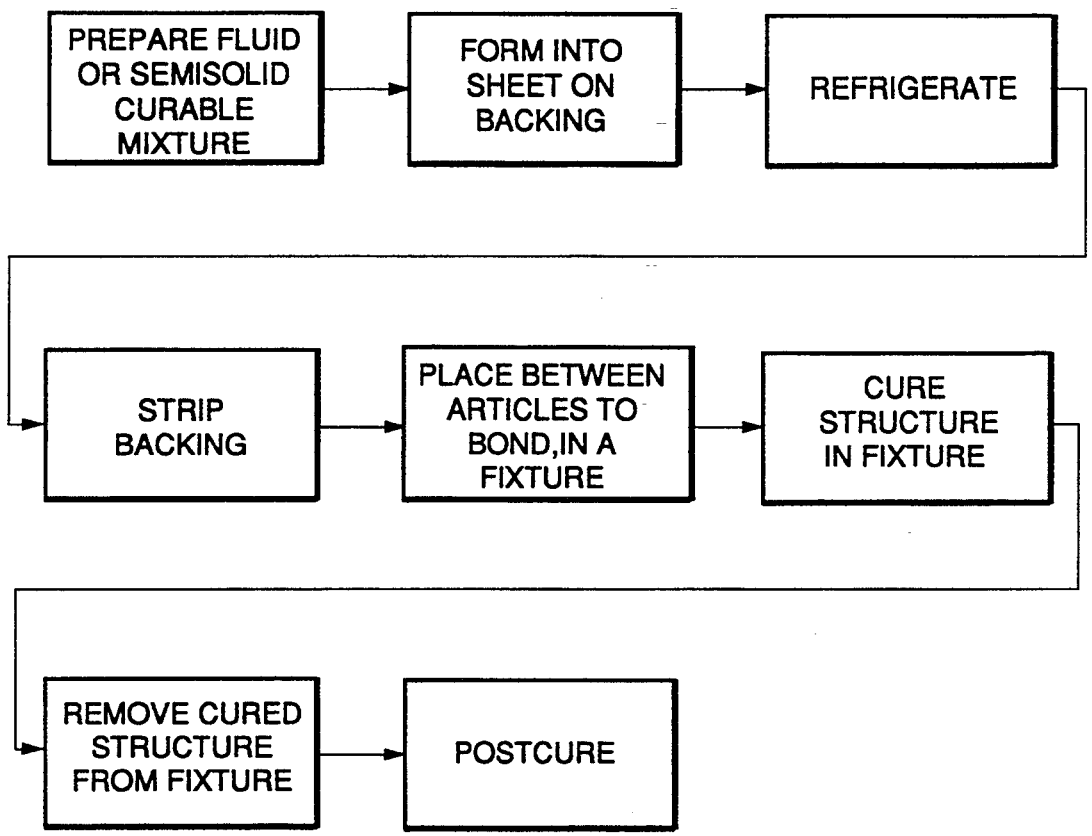
FIG. 5 is a process flow chart of a process for preparing an adhesively bonded structure.

One preferred application of the present invention is as the matrix of a composite material, and FIGS. 1 and 2 depict the process and product of this application. Referring to FIG. 1, a mixture having a composition of 100 parts by weight of an epoxy resin and from about ½ to about 10, preferably about 3, parts by weight of an imidazole curing agent is prepared. The epoxy resin is of the form

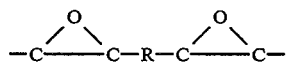

where R can be

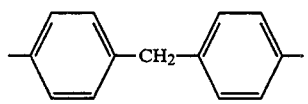

or

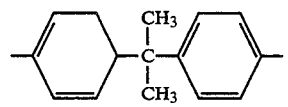

The epoxy resin is preferably a diglycidyl ether of bisphenol A having a general structure

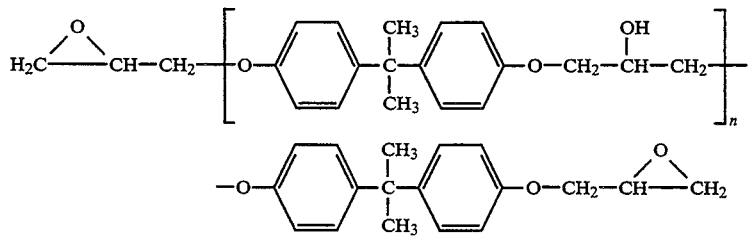

where n may be 0 or greater, but is generally from about 0.15 to about 2. This material is available commercially from several sources, for example, as Shell Chemical Epon 828 or Dow Chemical DER 331. The epoxy resin may also be an epoxy novolac having the form

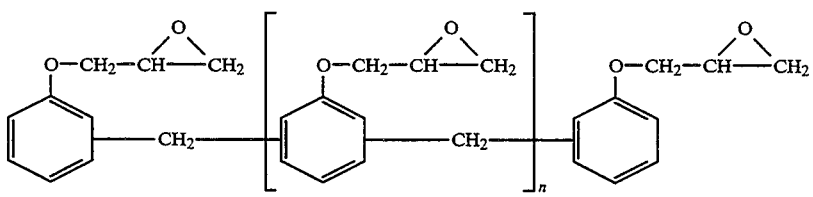

where N may be 0 or higher, but is preferably from about 0.2 to about 1.8. Such a material is available commercially, such as Dow's DER 431.

Optionally, the molecular weight and viscosity of the system may be reduced by incorporation of monomeric epoxides such as phenyl glycidyl ether, butyl glycidyl ether, or cresyl glycidyl ether.

The imidazole curing agent is preferably 2-ethyl, 4-methyl imidazole of the form

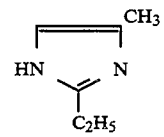

a secondary which can, under the proper conditions, react with the epoxy resin to produce a hardened, cross-linked structure. Other imidazoles such as 1-benzyl, 2-methyl imidazole of the form

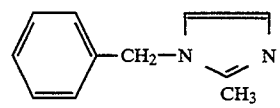

and 1-cyanoethyl, 2-ethyl, 4-methyl imidazole of the form

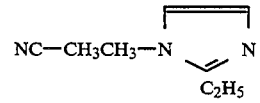

can be used. Other imidazoles are also operable.

If less than about ½ part by weight of the imidazole is present, the polymerization reaction does not occur to a sufficient degree to obtain a usable composite material. If more than about 10 parts by weight is present, the polymerization reaction leads to reduced properties of the final composite material and possibly to dangerous conditions such as a fire hazard.

The preferred 2-ethyl, 4-methyl imidazole curing agent, when purchased in small volumes (e.g., 100 gram bottles), is a semi-crystalline material which readily melts at slightly elevated temperature of about 140° F. When purchased in larger volumes (e.g., five-gallon containers,) the curing agent remains liquid at ambient temperature and may be weighed and incorporated directly. The imidazole curing agent is used alone, not in conjunction with other curing agents such as amines, anhydrides, etc., or as an accelerator.

The epoxy resin and the imidazole hardening agent are mixed together to form a smooth, homogeneous mixture by melting the imidazole, if solid, and adding it to the resin with agitation. The mixing is continued for approximately one hour during which time the imidazole dissolves and may partially react with the resin. Other modifying agents such as tougheners, tackifiers, and flow control agents may thereafter be added to the mixture depending upon the method and type of application intended. Various applications include filament winding, hot melt application, wet layup, or solution dipping. For example, in accomplishing prepregging by the solution dip method, the solution is adjusted to the proper consistency, that of a thin, labile liquid by addition of a suitable amount of a solvent. A preferred solvent for the mixture of Epon 828 and 2-ethyl, 4-methyl imidazole is acetone, although any other operable solvent can be used. Other additions such as pigments (for electrostatic discharge control) or fillers (for viscosity adjustment) can also be made.

No noxious or dangerous chemicals are used in this mixture, unlike the approach of U.S. Pat. No. 3,989,673, where piperidine is required. Additionally, tile 2-ethyl, 4-methyl imidazole curing agent poses no exotherm problem during initial resin mixing, having a 2–5 degree exotherm. By contrast, the piperidine curative at a 10 phr concentration reacts so vigorously that resin mixes using this curative are limited to 100–150 gram batch sizes and must be cooled to prevent runaway reactions. Much larger batches of resin and the imidazole curing agent can be prepared without difficulty.

A resin-impregnated composite material, termed a "prepreg" prior to curing, is prepared by dipping reinforcement materials into the solution, or, alternatively, supplying an excess of the solution to a mass of the reinforcement. The uncured prepreg material is dried to remove the solvent. The epoxy resin/imidazole hardener/fabric is a solid, unreacted mixture that holds its shape sufficiently for handling and storage. The prepreg may be stored at a reduced temperature (e.g., 0 F. or below) for a per led of several months. When the prepreg material is to be used, protective paper or film covers are stripped off and the sheets are placed into the selected position in a process termed "layup", a long with other sheets to form a structure. Normally, the structure that is prepared in this manner is supported on tooling that causes the composite prepreg to assume the desired shape.

The laid-up composite structure is cured by heating the structure, on its tooling, to a temperature of about 130 F. for a time of about 6–16 hours. This curing process causes the imidazole hardening agent to react with the epoxy resin to harden the epoxy resin. The curing at 130 F. for 6–16 hours produces a degree of polymerization of the epoxy resin of about 66 percent or more of the maximum attainable. To achieve the maximum polymerization, the composite structure is post-cured at a temperature of about 250 F. for a further 1–2 hours. Composites produced at this temperature exhibit excellent properties at 350–400 F. despite the 250 F. cure.

FIG. 2 illustrates a final composite structure 20, having a plurality of fibers 22 embedded within a matrix 24 of the cured and post-cured resin. These fibers 24 have been illustrated as randomly oriented, but they may be preferentially oriented as desired.

An important characteristic of the resin system of the invention is that it has very little volume change during curing, and what volume change is present is an expansion rather than the contraction which occurs with many resin systems upon curing. This minimal volume change upon curing has at least two important consequences. First, there is little macroscopic distortion of the structure upon curing and post-curing. It is therefore possible to cure the structure on the tooling, but then remove the tooling for the post-curing treatment. The ability to complete the curing during the post-curing treatment without tooling is important, because the tooling used for the initial curing treatment need not be designed to withstand the higher post-curing temperatures. Second, by curing at low temperatures with little volume change during curing, there is little residual stress within the cured resin when the structure is eventually cooled to ambient or sub-ambient temperatures. Such residual stress, if high, can cause microcracking in the resin that can lead to distortion and reduction in properties of the composite structure over time and with repeated thermal cycling.

Composite materials have been prepared using the approach of the invention. In one, about 45 percent by volume of Kevlar fibers was embedded in a matrix obtained by reacting a mixture of 100 parts by weight of Epon 828 epoxy resin and 3 parts by weight of 2-ethyl, 4-methylimidazole, in the manner discussed. In another, a range of samples having from 48 to 64 percent by volume of graphite fibers was embedded in a matrix obtain ed by reacting a mixture of 100 parts by weight of Epon 830 epoxy resin, 3 parts by weight of 2-ethyl, 4-methylimidazole, ½–1 part by weight of Cab-O-Sil, a silica-based fibrous filler that increases the viscosity of the mixture prior to curing, and ½–1 part by weight of carbon black. The resin mixture was applied without solvent addition to an impervious paper carrier. The fabric was mated to the carrier and warmed slightly, causing the resin to be transferred to the fiber to prepare a film-transfer prepreg.

Samples of these materials were prepared as laminates in either an autoclave or vacuum bag procedure. Curing was at 130 F. for 6–16 hours, and post-curing was at 250 F. for 2 hours. Samples were retained of the composite that was cured but not post-cured, for measurements.

Completed composite samples exhibited a softening temperature of 350°F. In outgassing tests, the composites prepared with Epon 830 epoxy resin exhibited a TML (total mass loss) of 0.35 percent without post-cure and 0.68 percent with post-cure; a CVCM (collected volatile condensable material) of 0.00 percent both without and with post-cure; and a WVR (water vapor recovery) of 0.14 percent with post-cure. The composite materials prepared with Epon 828 exhibited a TML of 0.10 percent without post-cure and 0.27 percent with post cure; and CVCM of 0.00 percent both without and with post-cure; and a WVR of 0.17 percent without post-cure and 0.15 percent with post-cure. All of these outgassing results are within NASA requirements for composite materials to be used in a space environment.

The mechanical properties of the composite materials were also determined. For the graphite fiber/EPON 830 composites with the test results for ambient temperature normalized to 62 percent fiber volume, the tensile strength was about 29,000 pounds per square inch (Ksi) and the tensile modulus was about 17,000,000 pounds per square inch (Msi). The flexural strength was about 15 Ksi and the flexural modulus was about 15 Msi. Another type of graphite cloth prepreg had a tensile strength of 105 Ksi, a tensile modulus of 19 Msi, a flexural strength of 56 Ksi, and a flexural modulus of 14 Msi, all measured at ambient temperature. Elevated temperature tests were performed at a temperature of 350 F. for this material. At 350 F. the material had a tensile strength of 97 Ksi, a tensile modulus of 16.6 Msi, a flexural strength of 38 Ksi, and a flexural modulus of 13.3 Msi. For the Kevlar/Epon 828 composite materials tested at ambient temperature, the tensile strength was about 67 Ksi and the tensile modulus about 4.2 Msi. The flexural strength was about 32 Ksi and the flexural modulus was about 3.4 Msi.

Tackifiers and tougheners such as nitrile rubbers may be added to the resin to vary its fiber coating characteristics and to improve the toughness and impact resistance of the resulting composite materials.

The low volume change on curing and low cure temperature also suggests that the present curable resin systems can find use in cast applications, such as the potting of electronic components illustrated in FIGS. 3 and 4. There, the curable mixture is prepared in the same manner as described previously (but typically with no fiber phase present). The fluid mixture is cast around an electronic component and cured/post-cured as previously described. The resulting device, shown in FIG. 4, is a potted electronic component 30 containing an electronic component 32 surrounded on at least some of its sides by a body 34 of cured/post-cured resin material.

Figure 6:
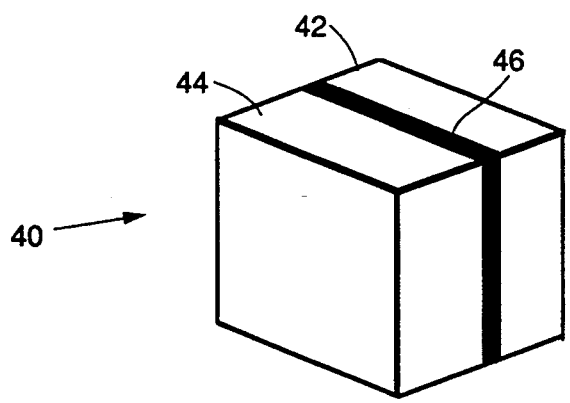
FIG. 6 is a perspective view of an adhesively bonded structure prepared by the process of FIG. 5.

The use of the present invention in adhesive applications is illustrated in FIGS. 5 and 6. The adhesive can be prepared in fluid form as described previously or as a strippable sheet of adhesive and this latter approach will be described in more detail. To increase the wettability of the resin system to the surfaces of articles to be bonded and to improve the toughness of the finished adhesive, a polymeric elastomeric material is added to the formulation in an amount sufficient to improve toughness but not substantially reduce the strength. Preferably, the elastomer is present in the amount of from about 5 to about 50 (most preferably, 20) parts by weight, together with 100 parts of epoxy resin and from about ½ to about 10 (most preferably, 3) parts by weight of the imidazole hardener. If less than about 5 parts by weight of the elastomer is present, there is no improvement to the properties. If more than about 50 parts by weight is present, other properties such as strength, viscosity, and maximum service temperature are adversely affected.

A wide variety of elastomers or other modifiers may be used. Epoxy terminated, polybutadiene acrylonitrile polymer, polysulfide, and epoxidized polysulfide elastomers have been utilized successfully in preparing the adhesive. It is expected that other elastomers such as thermoplastic and thermosetting block copolymers, high modulus reactive silicones, cyanate esters, etc., will also be operable.

The epoxy resin, hardener, and elastomer are mixed together, with a solvent such as acetone to adjust the consistency of the mixture as necessary. For preparing a film or sheet adhesive, the mixture is made to be relatively viscous, with a dough-like consistency. After mixing, the mixture is applied to a backing sheet as a thin layer, and a protective release film is placed over the thin layer. The thin adhesive layer is then used, or, more typically, refrigerated at a temperature sufficiently low that the resin will not cure, typically about 0 F, prior to use.

When the adhesive is to be used, the backing sheet is stripped away and the adhesive film applied to the surface of one of the two articles to be bonded. The release film is stripped away, and the other article is pressed against the adhesive to create a sandwich with the film adhesive between the two articles. The adhesive is cured in the manner discussed previously, typically at 130 F. for 16 hours with the articles held in a fixture. The bonded articles are removed from the fixture and post-cured, typically at 250 F. for 2 hours.

FIG. 6 illustrates the final bonded structure. Two articles 42 and 44 are bonded together with a film 46 of cured adhesive.

Structures were prepared in the manner described, using no elastomer addition, and acrylonitrile, polysulfide, and epoxidized polysulfide elastomers in amounts of 15 to 20 parts by weight. Low outgassing levels were observed, within the NASA requirements. The lap shear strength (as measured by ASTM D1002 at ambient temperature) of the post-cured material with no elastomer addition was 2100 psi, and the lap shear strengths with elastomer addition ranged from 2800 to 3100 psi. For Kevlar (R)/aluminum honeycomb sandwiches, the flexural strength of the post-cured material with no elastomer was 4,140 pounds per square inch, and the flexural strength of the post-cured material with acrylonitrile elastomer in an amount of 20 parts by weight was 10,770 pounds per square inch. This significant improvement in shear strength and flexural properties results at least in part from the improved toughness of the cured adhesive with the addition of elastomer.

The present invention thus provides an improved resin system curable at low temperatures. Although particular embodiments of the invention have been described in detail for purposes of illustration, various modifications may be made without departing from the spirit and scope of the invention. Accordingly, the invention is not to be limited except as by the appended claims.

What is claimed is:

1. An embedded structure, comprising:
   a matrix produced by reacting together 100 parts by weight of an epoxy resin and from about ½ to about 10 parts by weight of a liquid imidazole curing agent, and without any piperidine present; and
   an article embedded in the matrix.

2. The embedded structure of claim 1, wherein the epoxy resin is selected from the group consisting of a diglycidyl ether of bisphenol A, bisphenol F, and an epoxy novolac.

3. The embedded structure of claim 1, wherein the epoxy resin is an epoxide having an average of at least two free epoxides per molecule.

4. The embedded structure of claim 1, wherein the imidazole curing agent is selected from the group consisting of 2-ethyl, 4-methylimidazole, 1-benzyl, 2-methyl imidazole, and 1-cyano ethyl, 2-ethyl, 4-methyl imidazole.

5. The embedded structure of claim 1, wherein the article is an electronic component.

6. The embedded structure of claim 1, wherein the article is a mass of reinforcements, so that the embedded structure is a composite material.

* * * * *